United States Patent [19]
Madurawe et al.

[11] Patent Number: 5,488,586
[45] Date of Patent: Jan. 30, 1996

[54] METHOD AND APPARATUS FOR ERASING AN ARRAY OF ELECTRICALLY ERASABLE PROGRAMMABLE READ ONLY MEMORY CELLS

[75] Inventors: Raminda Madurawe, Sunnyvale; Dominik Schmidt, San Jose, both of Calif.

[73] Assignee: Altera Corporation, San Jose, Calif.

[21] Appl. No.: 328,303

[22] Filed: Oct. 24, 1994

[51] Int. Cl.$^6$ ..................................................... G11C 11/40
[52] U.S. Cl. ............................................ 365/218; 365/185
[58] Field of Search .................................... 365/185, 218, 365/900

[56] References Cited

U.S. PATENT DOCUMENTS 5,138,576  8/1992  Madurawe ............................. 365/185
5,220,533  6/1993  Turner ................................... 365/218

Primary Examiner—Do Hyun Yoo
Attorney, Agent, or Firm—Townsend and Townsend and Crew

[57] ABSTRACT

An apparatus and method of erasing memory cells while preventing overerasure of the memory cells is disclosed. By applying a large voltage across the floating gate of the memory cells, charge is removed from the floating gate. Once sufficient charge is removed from the floating gates of the memory cells to render them erased, a stop transistor halts the erasure process, thus preventing the overerasure of memory cells.

19 Claims, 1 Drawing Sheet

METHOD AND APPARATUS FOR ERASING AN ARRAY OF ELECTRICALLY ERASABLE PROGRAMMABLE READ ONLY MEMORY CELLS

BACKGROUND OF THE INVENTION

This invention relates to arrays of memory cells and, more particularly, to techniques for erasing such arrays.

Erasable programmable read-only memory ("EPROM") technology is well known for use in both memory and programmable logic applications. In particular, EPROMs are implemented using floating gate field effect transistors in which the binary states of the EPROM cell are represented by the presence or absence on the floating gate of sufficient charge to prevent conduction even when a normal high signal is applied to the gate of the EPROM transistor.

EPROMS are available in several varieties. In the traditional and most basic form, EPROMs are programmed electrically and erased by exposure to ultraviolet light. The EPROMs can be referred to as ultraviolet erasable programmable read-only memories ("UVEPROMs"). UVEPROMs are programmed by running a high current between the drain and the source of the UVEPROM transistor while applying a positive potential to the gate. The positive potential on the gate attracts energetic ("hot") electrons from the drain-to-source current, which jump onto the floating gate in an attempt to reach the gate and become trapped on the floating gate.

Another form of EPROM is the electrically erasable programmable read-only memory ("EEPROM" or "$E^2$PROM"). EEPROMs are programmed and erased electrically using a phenomenon known as Fowler-Nordheim tunneling.

Still another form of EPROM is "Flash EPROM," which is programmed using hot electrons like traditional EPROMs (i.e., UVEPROMs) and electrically erased using Fowler-Nordheim tunneling like an EEPROM. Both Flash EPROMs and EEPROMs-which can be erased in a "flash" or bulk mode in which all cells in an array can be erased simultaneously using Fowler-Nordheim tunneling-will be referred to hereinafter as "Flash cells" or "Flash devices."

Both UVEPROMs and EEPROMs have been used for both memory applications and programmable logic applications. One obstacle to using Flash devices is the phenomenon of overerasure. Overerasure is the result of continuing the Fowler-Nordheim erase process too long, so that too much charge is removed from the floating gate, with the result that the Flash device goes into depletion mode, in which it is always conducting (unless the gate-to-source voltage goes negative).

In a programmable logic device ("PLD") or memory chip in which there is an overerased Flash transistor, the leakage current resulting from the depletion mode operation of that transistor can interfere with accurate reading of the states of neighboring cells in the array. This can be cured by having in each cell a second "select" transistor, allowing the selection or deselection of a particular device for reading. Many flash memory applications employ such select transistors. However, in logic applications, the use of such a transistor consumes considerable space on the chip and impacts array speed.

One solution frequently employed to prevent overerasure of flash devices is to use an "intelligent" erasing algorithm in which the device is incrementally erased in small amounts and then verified to determine whether the memory cell threshold has shifted the desired amount, but not so far as to go into depletion mode. However, such a technique can be time-consuming and adds to programming complexity.

In commonly-assigned U.S. Pat. No. 5,138,576, hereby incorporated by reference in its entirety, a method and apparatus are disclosed for erasing individual cells in an array of electrically erasable EPROM cells. This is accomplished by connecting a select transistor to each row in the array and a switch to each column. An individual cell is selected to be erased by activating the appropriate switch and select transistor. When the memory cell is erased, a sense amplifier disconnects that cell from its erase line by controlling a stop transistor coupled to the column. While this circuit prevents overerasure, it still requires use of several additional circuit elements, such as the sense amplifier, switches and select transistor to isolate individual cells.

Accordingly, it would be desirable to erase an array of memory cells while preventing overerasure without impacting overall performance by using several additional circuit elements or the time-consuming intelligent erasure algorithm.

SUMMARY OF THE INVENTION

The present invention provides an apparatus and a method of erasing memory cells without incurring the phenomenon of overerasure.

According to the present invention a memory cell having a gate, a drain, a source, a floating gate (from which charge must be removed by placing a high potential difference thereacross to erase the cell), and an erase node is disclosed. The memory cell starts at an initial programmed state and is erased (to a low threshold voltage state) while preventing overerasure. The drain of the memory cell is connected to the gate of a stop transistor. The drain of the stop transistor is connected to a high voltage via a resistive element and is connected to the erase node of the memory cell.

To erase the memory cell, the source of the memory cell is connected to a first voltage, the gate of the memory cell is connected to ground potential, and the source of the stop transistor is connected to a second voltage. At the outset of the erasure process, the memory cell is in a programmed state with a negative charge on the floating gate. Because the memory cell is programmed, the cell will not conduct, and the drain will be at a low bias voltage, causing the stop transistor to be in an OFF state. A high voltage applied to the erase node causes removal of charge from the floating gate of the memory cell. The removal process induces a voltage change on the drain of the memory cell. When sufficient charge is removed from the floating gate of the memory cell, the memory cell is erased, allowing the voltage at its source to conduct to the drain of the memory cell. Then, a sufficiently large voltage is induced on the drain of the memory cell, which causes the stop transistor to conduct. When the stop transistor conducts, a current is forced through the resistive element causing a voltage drop across its terminals. This voltage drop reduces the voltage applied to the erase node of the memory cell and stops the erasure process.

In another embodiment of the present invention, memory cells in an array may be erased on a column-by-column basis, which is often the lowest level of granularity desired in erasing an array of memory cells. In this embodiment, the memory cells are connected in multiple rows and columns, with each column associated with one stop transistor and one resistive element. The sources, drains, and erase nodes of all the memory cells in one column are connected to a single drain line, single source line and single erase line, respectively. The gates of the stop transistors are connected to the drain lines of each column. The source of each stop transistor is connected to a high voltage via a resistive element. In operation, all memory cells of the array are programmed to a high threshold voltage state. Then, a first voltage is applied to the source line of a selected column, a second voltage is applied to the source of the respective stop transistor, and ground potential is applied to the gate line of the memory cell. The high voltage applied to the erase line of the selected column causes removal of charge from the floating gates of the memory cells. When a memory cell in the column is erased to the point where the memory cell begins to conduct, the voltage on the drain line of the selected column rises sufficiently to turn the stop transistor ON, which causes the erasure process to stop.

The present invention accomplishes the erasure of memory cells in an array while preventing overerasure without incurring the space costs of numerous additional circuit components or the time costs of incremental erasure of a memory cell.

DETAILED DESCRIPTION OF THE PREFERRED EMBODIMENT

Figure 1:
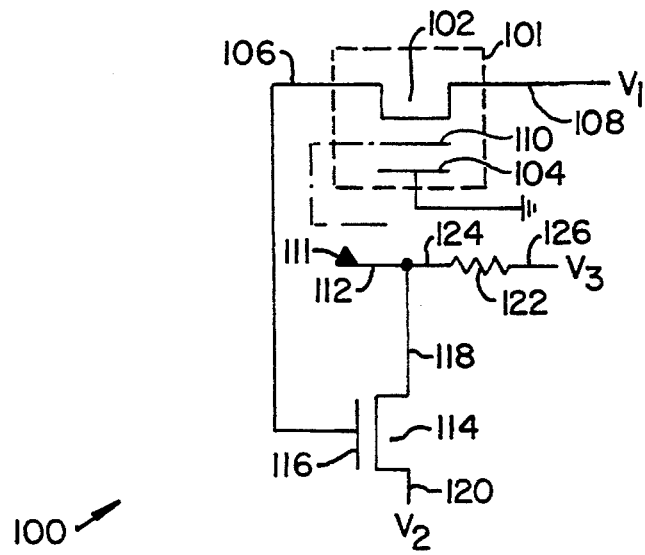
FIG. 1 illustrates the first embodiment of the present invention.

FIG. 1 illustrates a first embodiment of the present invention. In this embodiment, a single memory cell is erased using the concept of the present invention. FIG. 1 shows a memory cell transistor 101, erase node 111, stop transistor 114, and resistor 122. Memory cell 101 includes an EEPROM or flash EPROM with gate 104 that is connected to ground potential during the erasure, drain 106 that is connected to gate 116 of stop transistor 114, source 108, and floating gate 110 that is connected to erase node 111. Stop transistor 114 includes gate 116, drain 118 which is connected to terminal 112 of erase node 111, and terminal 124 of resistor 122, and source 120. In the embodiment of FIG. 1, erase node 111 is a tunnel diode which is formed in the silicon wafer as part of the flash device, regardless of the type of memory cell.

As described above, a programmed memory cell holds an electron charge on its floating gate. Therefore, to erase the memory cell, the charge must be removed from the floating gate. However, excessive removal of electron charge results in changing the field effect transistor to a depletion mode transistor. Thus, the electron removal process, i.e. the erasure process, must be stopped before transistor 102 enters the depletion mode.

To erase memory cell 101, electron charge must be removed from floating gate 110. This is done by applying a large erase voltage, typically 10–20 volts, to erase node 111. This causes Fowler-Nordheim tunneling to occur between floating gate 110 and erase node 111, removing electrons from floating gate 110.

In the present invention, a large voltage $V_3$ is applied to terminal 112 of erase node 111 via resistor 122, as shown in FIG. 1. At the beginning of the erasure process, transistor 114 is OFF and no current flows through resistor 122, therefore the full voltage $V_3$ is applied to node 111. Furthermore, to achieve erasure according to the present invention, voltage $V_1$ must be applied to source 108 and voltage $V_2$ must be applied to source 120. Typically, $V_1$ and $V_2$ may be between 0 and 2 volts, and $V_3$ is 15 volts.

Before the start of erasure, drain 106 carries a negative initial voltage which is induced by the electron charge present on floating gate 110. As the electron charge is removed from floating gate 110, because of the Fowler-Nordheim tunneling effect, the voltage at drain 106 becomes less and less negative. Once enough electrons have been removed from floating gate 110, such that the threshold voltage of memory cell transistor 102 measured from the floating gate equals the threshold voltage of a typical enhancement mode field effect transistor (e.g. 0.7 volts), memory cell transistor 102 begins to conduct. Transistor 102 conducts at this point because the voltage drop between floating gate 110 and drain 106 is larger than the threshold voltage. The voltage at drain 106 is sufficiently large to turn stop transistor 114 ON, which creates a path for current to flow from voltage $V_3$ through resistor 122 and transistor 114. The value of resistor 122 is chosen such that this current, although small, causes a large voltage drop across resistor 122. This voltage drop is sufficient to reduce the voltage applied to terminal 112 to a level which is no longer capable of causing the removal of electrons from floating gate 110. The invention therefore limits the erasure process to maintain memory cell transistor 102 in enhancement mode. It should be noted that the values of $V_1$, $V_2$ and $V_3$ may be chosen to optimize the erase voltage of the memory cell.

Figure 2:
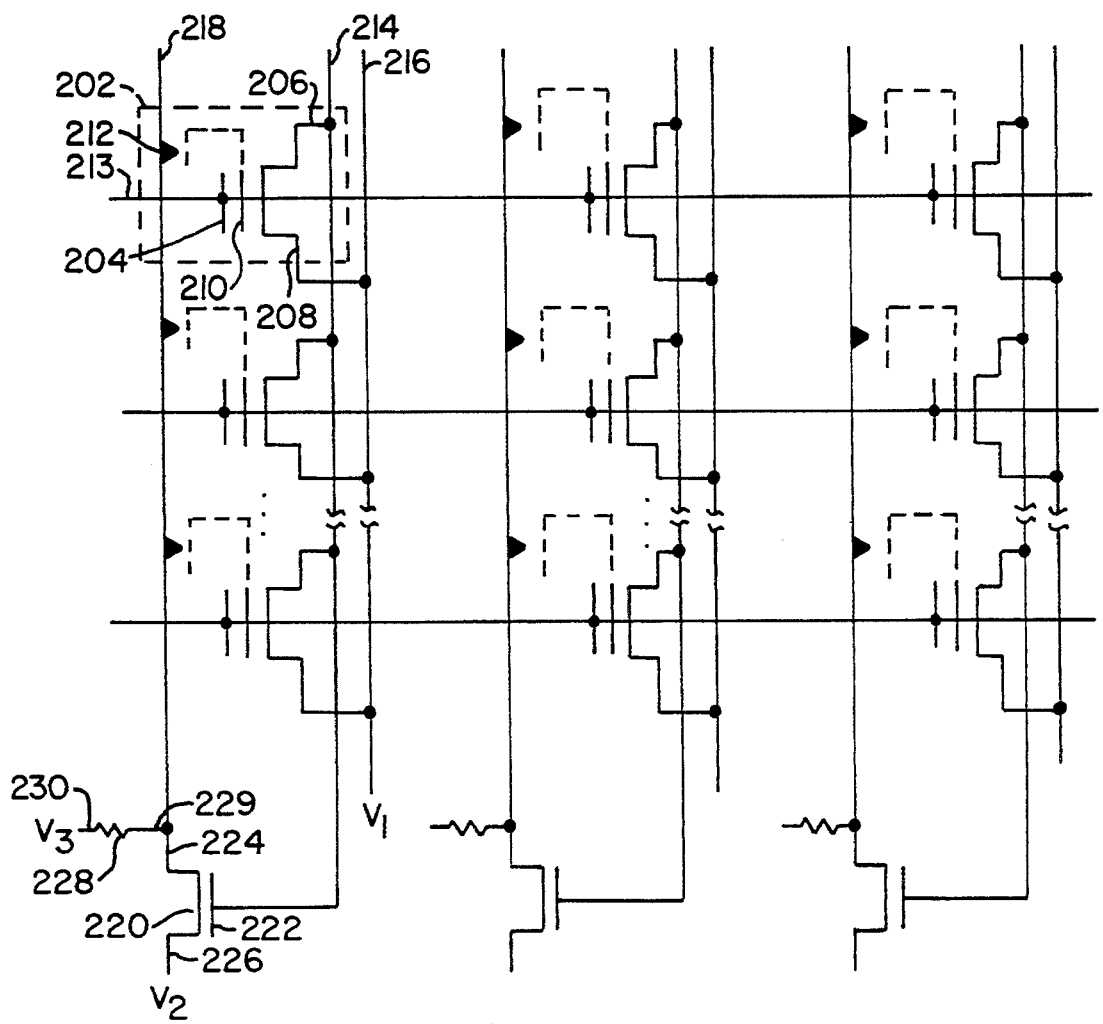
FIG. 2 illustrates the preferred embodiment of the present invention.

The technique of the present invention as explained above can be used to erase a column of memory cells in a two dimensional array of memory cells. FIG. 2 illustrates a representative portion of a two dimensional array of flash EPROM or EEPROM cells.

FIG. 2 further illustrates additional elements as required by the present invention to enable erasure of a column of memory cells at a time. FIG. 2 shows memory cells 202 which are arranged in multiple rows and columns, three of which are shown in FIG. 2. Each memory cell includes control gate 204, drain 206, source 208, floating gate 210, and erase node 212. Since memory cells 202 are all formed on a single semiconductor die, they typically have the same characteristics. FIG. 2 further shows gate lines 213, drain lines 214, source lines 216, erase lines 218, stop transistors 220 and resistors 228. Each column is associated with one drain line 214 connected to drain 206 of memory cells 202, one source line 216 connected to source 208 of memory cells 202, one erase line 218 connected to erase node 212 of all memory cells 202 in that column, one stop transistor 220, and one resistor 228. Each stop transistor 220 includes gate 222 which is connected to drain line 214 of the respective column, drain 224 which is connected to erase line 218 of the respective column, and a source 226. Resistor 228 is connected to erase line 218 of the respective column on one side at node 229. Each row of memory cells 202 is associated with one gate line 213 which is connected to all gates 204 of memory cells 202 in that particular row.

To erase memory cells 202 in a selected column according to the present invention, it is necessary that all memory cells 202 be programmed to a high $V_t$ state; otherwise, the erase cell will provide a conductive path for voltage $V_1$ on node 216 to pass onto node 214, raising the gate voltage at node 222 such that transistor 220 is ON. This will cause a large current to flow across resistor 228, which prevents node 218 from reaching erase voltage $V_3$. Furthermore, similar to the erasure process of memory cell 102 of FIG. 1, certain voltages must be applied to selected nodes of the selected column to facilitate erasure of memory cells 202 of that column. As shown in FIG. 2, during the erasure process, voltage $V_1$ is applied to source line 216 of the selected column, ground potential is applied to all gate lines 213, and voltage $V_2$ is applied to source 226 of stop transistor 220 of the selected column. As explained above, erasure occurs when a high erase voltage is applied to erase node 212 of each memory cell 202. In FIG. 2, voltage $V_3$ is applied to erase line 218 across resistor 228. Since transistor 220 is OFF at the outset of the erasure process, there is no current through resistor 228, which means that the full voltage $V_3$ is applied to erase line 218. As noted above, voltage $V_3$ is typically 10–20 volts.

Before the erasure process, drain line 214 of the selected column is floating; however, the negative charge present on floating gate 210 of each memory cell 202 in the selected column induces a negative voltage at the respective drain 206 of each memory cell. This causes the presence of a cumulative negative voltage on drain line 214 of the selected column. This negative voltage, which is applied to gate 222 of the corresponding stop transistor 220, keeps the stop transistor 220 OFF. As long as stop transistor 220 is OFF, there is no path for current to flow through resistor 228. Accordingly, during the erasure process, high voltage $V_3$ is applied directly to erase line 218, with no voltage drop across resistor 228.

During erasure, electrons are removed from floating gate 210 of memory cells 202 of the selected column according to the Fowler-Nordheim tunneling principle. As the electrons are removed, the threshold voltage on each memory cell approaches the threshold voltage of an unprogrammed enhancement field effect transistor (e.g. 0.7 volts). Furthermore, as the electrons are removed from each floating gate 210, the magnitude of the induced negative voltage on the respective drain 206 reduces. This results in the reduction of the magnitude of the total negative voltage on drain line 214 of the selected column. The erasure continues until one memory cell 202 in the selected column starts to conduct. This happens when sufficient electron charge is removed from the floating gate of the conducting memory cells 202 such that the threshold voltage of the memory cell is equal to the threshold voltage of a normal enhancement field effect transistor. Furthermore, the voltage drop between gate 204 and drain 206 of the conducting memory cell 202 is larger than its threshold voltage.

At this point, the voltage on drain line 214 applied to gate 222 of transistor 220 is sufficient to turn transistor 220 ON. Once transistor 220 is ON, a current path through resistor 228 is established. Accordingly, the voltage applied to erase line 218 is reduced because of the voltage drop across resistor 228 caused by the current passing through the resistor. At this point the voltage applied to erase line 218 of the selected column is equal to $V_3$ minus the voltage drop across resistor 228, which is not enough to remove additional electron charges from floating gate 210. Thus, the erasure process stops as soon as one memory cell 202 in the selected column begins to conduct.

The above embodiment eliminates the need for a select transistor used along with the stop transistor in other methods of limiting overerasure, saving considerable space on the PLD chip and improving array speed. It is also an improvement over the time-consuming and complex "intelligent" erasure algorithm because the invention does not require repeated incremental erasing steps of the memory cell.

The present invention has now been explained with reference to specific embodiments. Other embodiments will be apparent to those of ordinary skill in the art. It is therefore not intended that this invention be limited except as indicated by the appended claims.

What is claimed is:

1. An apparatus for erasing memory cells while preventing overerasure of the cells comprising:
   a memory cell having a gate, a drain, a source, and a floating gate from which charge must be removed by placing a potential thereacross to erase said memory cell;
   an erase node for applying said potential across said floating gate;
   a stop transistor having a gate directly coupled to said drain of said memory cell, a source, and a drain directly coupled to said erase node, said stop transistor preventing overerasure of said memory cell when a threshold voltage is reached on said gate of said stop transistor; and
   a resistive element having a first terminal coupled to said drain of said stop transistor and a second terminal.

2. The apparatus of claim 1 wherein when the source of said memory cell is coupled to a first voltage, the source of said stop transistor is coupled to a second voltage, the gate of said memory cell is coupled to ground potential, and said second terminal of said resistive element is directly coupled to a third voltage, said third voltage causing removal of said charge from said floating gate of said cell through said erase node, removal of said charge causes a voltage to be induced at said drain of said memory cell such that when sufficient charge is removed from said cell, said induced voltage on said drain causes said stop transistor to conduct and force a voltage drop across said resistive element, said voltage drop causing the erasing of memory cells to stop.

3. The apparatus of claim 2 wherein said voltage drop reduces said potential at said erase node and stops further removal of said charge from said floating gate.

4. The apparatus of claim 1 wherein said memory cell comprises an electronically erasable programmable read only memory.

5. The apparatus of claim 1 wherein said memory cell comprises a flash erasable programmable read only memory.

6. The apparatus of claim 1 wherein said erase node comprises a tunnel diode.

7. The apparatus of claim 2 wherein a threshold erase voltage of said memory cell is altered through control of said first voltage, said second voltage and said third voltage.

8. An apparatus for erasing memory cells while preventing overerasure comprising:
   memory cells, each having a gate, a drain, a source, and a floating gate from which charge must be removed by placing a potential thereacross to erase said cell, said cells connected in parallel columns and parallel rows which are orthogonal to said columns;
   an erase node associated with each memory cell for applying said potential across the floating gate of said memory cell;
   source lines, each coupled to the source of each cell in a column;
   drain lines, each coupled to the drain of each cell in a column;
   gate lines, each coupled to the gate of each cell in a row;
   erase lines, each directly coupled to said erase node of each cell in a column;
   stop transistors, each associated with one column and having a gate directly coupled to the drain line of said column, a source, and a drain coupled to the erase line associated with said column; and resistive elements, each associated with one stop transistor and having a first terminal coupled to the drain of said stop transistor and a second terminal.

9. The apparatus of claim 8 wherein when said source line in a selected column is coupled to a first voltage, the source of said associated stop transistor is coupled to a second voltage, said gate lines are coupled to ground potential, and the second terminal of said associated resistive element coupled to said stop transistor in said selected column is directly coupled to a third voltage, said third voltage causing removal of said charge from the floating gates of said memory cells coupled to said selected column through said erase nodes, removal of said charge causes a voltage to be induced on said drain line of said selected column such that when sufficient charge is removed from any one of said cells in said selected column, said induced voltage of said drain line causes said stop transistor to conduct and force a voltage drop across said associated resistive element, said voltage drop causing the erasing of memory cells to stop.

10. The apparatus of claim 9 wherein said voltage drop reduces said potential at said erase line and stops further removal of said charge from the floating gates of cells coupled to said selected column.

11. The apparatus of claim 8 wherein said memory cells comprise electronically erasable programmable read only memory cells.

12. The apparatus of claim 8 wherein said memory cells comprise flash erasable programmable read only memory cells.

13. The apparatus of claim 8 wherein said erase node comprises a tunnel diode.

14. The apparatus of claim 9 wherein a threshold erase voltage of said memory cell is altered through control of said first voltage, said second voltage and said third voltage.

15. A method for erasing a memory cell in a memory device while preventing overerasure, the memory device comprising the memory cell having a gate, a drain, a source, a floating gate from which charge must be removed by placing a potential thereacross to erase the cell, an erase node for applying the potential across the floating gate, a stop transistor having a gate directly coupled to the drain of the memory cell, a source and a drain directly coupled to the erase node, and a resistive element having a first terminal directly coupled to the drain of the stop transistor and a second terminal, the method comprising the steps of:

applying a first voltage to the source of the memory cell;

applying a second voltage to the source of the stop transistor;

applying ground potential to the gate of the memory cell;

applying a third voltage to the second terminal of the resistive element, said third voltage causing a voltage to be induced at the drain of the memory cell;

activating the stop transistor with said induced voltage; and forcing a voltage drop across the resistive element, said voltage drop causing erasing of the memory cell to stop.

16. The method of claim 15 wherein the memory cell comprises an electronically erasable programmable read only memory cell.

17. The method of claim 15 wherein the memory cell comprises flash erasable programmable read only memory cell.

18. The method of claim 15 wherein the erase node comprises a tunnel diode.

19. The method of claim 15 further including the step of altering a threshold erase voltage of said memory cell through control of said first voltage, said second voltage and said third voltage.

* * * * *